United States Patent
Feng et al.

(10) Patent No.: US 9,420,648 B2
(45) Date of Patent: Aug. 16, 2016

(54) TIMING CIRCUITS AND DRIVING CIRCUITS USED IN LIGHTING SYSTEMS

(71) Applicant: Chengdu Monolithic Power Systems Co., Ltd., Chengdu (CN)

(72) Inventors: Lin Feng, Chengdu (CN); Yuedong Chen, Chengdu (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 0 days.

(21) Appl. No.: 14/644,068

(22) Filed: Mar. 10, 2015

(65) Prior Publication Data

US 2015/0257219 A1    Sep. 10, 2015

(30) Foreign Application Priority Data

Mar. 10, 2014  (CN) .......................... 2014 1 0085533

(51) Int. Cl.
*H05B 33/08* (2006.01)
*H03K 21/02* (2006.01)
*H05B 37/02* (2006.01)

(52) U.S. Cl.
CPC .......... *H05B 33/0815* (2013.01); *H03K 21/023* (2013.01); *H03K 21/026* (2013.01); *H05B 37/0281* (2013.01); *Y02B 20/348* (2013.01); *Y02B 20/42* (2013.01)

(58) Field of Classification Search
None
See application file for complete search history.

(56) References Cited

U.S. PATENT DOCUMENTS

| | | | | |
|---|---|---|---|---|
| 8,400,127 B2 * | 3/2013 | Chen | ..................... | H02M 3/156 323/282 |
| 8,513,901 B2 * | 8/2013 | Khayat | ............... | H05B 33/0815 315/291 |
| 8,810,156 B2 * | 8/2014 | Brassfield | .......... | H05B 33/0818 315/291 |
| 8,901,851 B2 * | 12/2014 | Kuang | ............... | H05B 33/0851 315/186 |
| 8,937,434 B2 * | 1/2015 | Datta | ................. | H05B 33/0845 315/200 R |
| 8,988,002 B2 * | 3/2015 | Okubo | .......................... | 315/291 |
| 9,084,309 B2 * | 7/2015 | Khayat | ............... | H05B 37/0227 |

* cited by examiner

*Primary Examiner* — Alexander H Taningco
*Assistant Examiner* — Nelson Correa
(74) *Attorney, Agent, or Firm* — Perkins Coie LLP (57) ABSTRACT

A timing circuit used in lighting systems includes a first logic circuit, a first counter, a latching circuit and a judging circuit. The first logic circuit generates a first logic signal and a second logic signal based on a falling edge of a detecting signal. The first counter generates a first counting signal and a second counting signal based on the second logic signal, wherein the counting period of the first counting signal is longer than that of the second counting signal. The latching circuit samples and holds the first counting signal based on the first logic signal and provides a third counting signal. The judging circuit detects whether the second counting signal is equal to the third counting signal and provides a timing signal.

20 Claims, 8 Drawing Sheets

TIMING CIRCUITS AND DRIVING CIRCUITS USED IN LIGHTING SYSTEMS

CROSS-REFERENCE TO RELATED APPLICATION(S)

This application claims priority to and the benefit of Chinese Patent Application No. 201410085533.4, filed on Mar. 10, 2014, which is incorporated herein by reference in its entirety.

TECHNICAL FIELD

The present invention generally relates to electronic apparatuses, and more particularly but not exclusively to timing circuits or driving circuits used in lighting systems.

BACKGROUND

Figure 1:
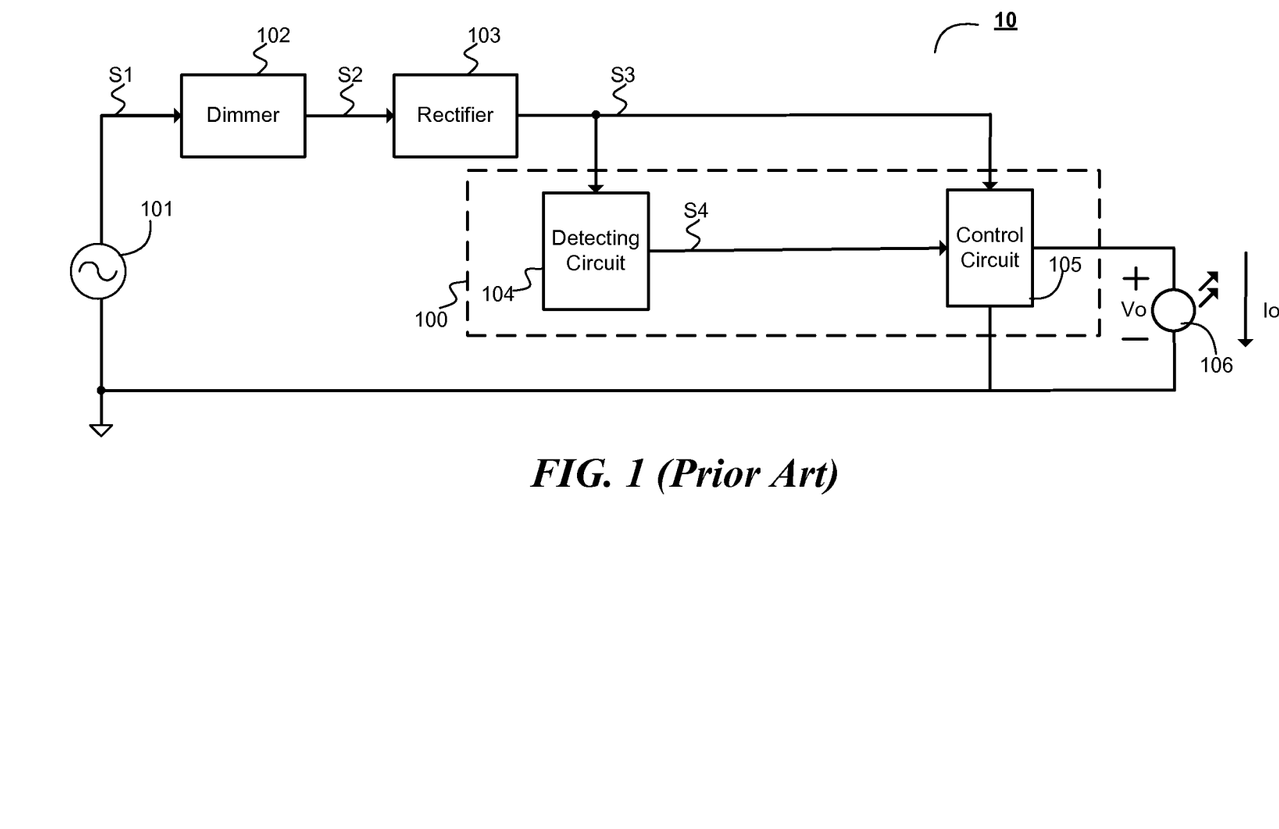
FIG. 1 schematically illustrates a prior art conventional lighting system 10.

Dimming technologies are widely used in lighting systems such as incandescent lamp lighting, energy-saving lamp lighting and LED lighting. FIG. 1 schematically illustrates a conventional lighting system 10 including nonlinear light-emitting devices such as LED. The lighting system 10 comprises a power supply 101, a dimmer 102, a bridge rectifier 103, a light-emitting device 106 and a driving circuit 100. In some applications, the power supply 101 could provide the residential electricity to the dimmer 102. The dimmer 102 has an input terminal configured to receive an input signal S1 and an output terminal configured to provide a dimmed signal S2. Normally, a three terminal bidirectional thyristor switch tube (TRIAC) is served as the dimmer 102. The brightness of the light-emitting device 106 would be changed by adjusting the ON time of the TRIAC. The bridge rectifier 103 has an input terminal configured to receive the dimmed signal S2 and an output terminal configured to provide a half wave signal S3. The driving circuit 100 comprises a detecting circuit 104 and a control circuit 105. The detecting circuit 104 detects the ON time or the OFF time of the dimmer 102 based on the half wave signal S3, and provides a detecting signal S4 at the output terminal. Based on the ON time or the duty cycle of the detecting signal S4, the control circuit 105 adjusts voltage or average current of the light-emitting device 106, so as to adjust the brightness.

Figure 2:
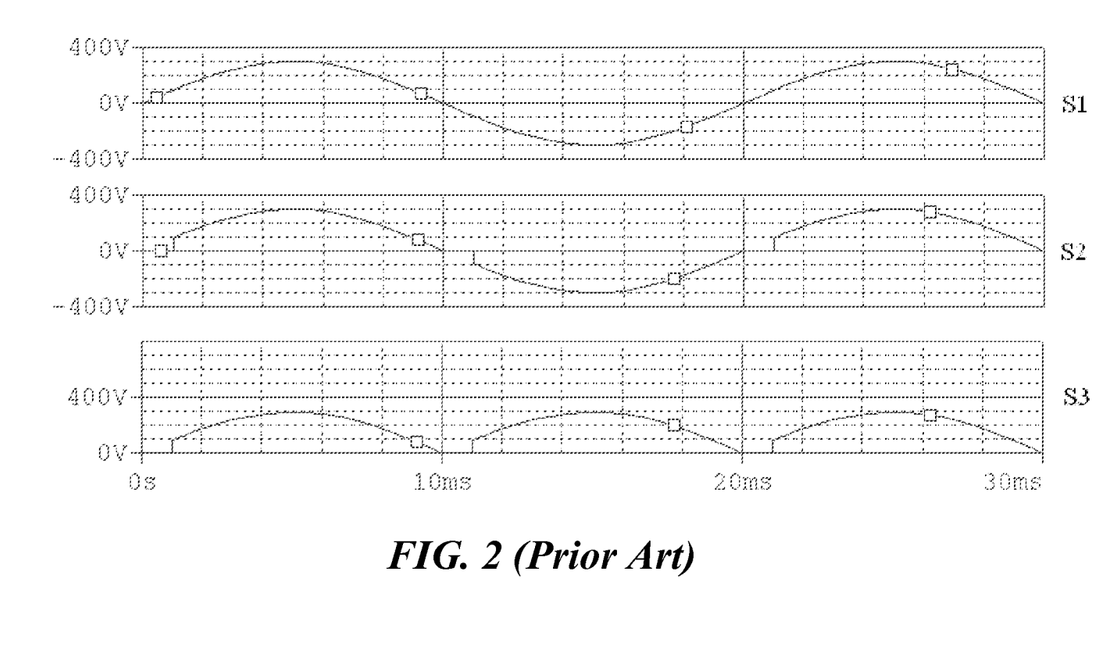
FIG. 2 illustrate operational waveforms of the lighting system 10.

In an ideal case, the input signal S1 and the dimmed signal S2 would be exactly the same if the TRIAC is fully turned on. However, in most cases, the duty cycle of the TRIAC may only be 85% or lower even if the knob (dimming button) of the TRIAC is turned to its maximum conduction status, such as shown in FIG. 2. Furthermore, different dimmers have different maximum duty cycles since they have different conduction characteristics, which leads to different maximum output power for different lighting systems. This may cause light-emitting devices in the same region to have different brightness. Designing lighting systems that have uniform maximum brightness for different dimmers becomes a challenge.

SUMMARY

Embodiments of the present invention are directed to a timing circuit, comprising: a first logic circuit having an input terminal, a first output terminal and a second output terminal, wherein the input terminal is configured to receive a detecting signal, and wherein based on a falling edge of the detecting signal, the first logic circuit provides a first logic signal and a second logic signal at the first output terminal and the second output terminal respectively; a first counter having a control terminal, a first output terminal and a second output terminal, wherein the control terminal is coupled to the second output terminal of the first logic circuit for receiving the second logic signal, and wherein based on the second logic signal, the first counter generates a first counting signal at the first output terminal and a second counting signal at the second output terminal, and wherein a counting period of the first counting signal is longer than a counting period of the second counting signal; a latching circuit having a control terminal, an input terminal and an output terminal, wherein the control terminal is coupled to the first output terminal of the first logic circuit for receiving the first logic signal, and wherein the input terminal is coupled to the first output terminal of the first counter for receiving the first counting signal, and wherein based on the first logic signal, the latching circuit samples and holds the first counting signal and provides a third counting signal at the output terminal; and a judging circuit having a first input terminal, a second input terminal and an output terminal, wherein the first input terminal is coupled to the second output terminal of the first counter for receiving the second counting signal, the second input terminal is coupled to the output terminal of the latching circuit for receiving the third counting signal, and wherein the judging circuit detects whether the second counting signal is equal to the third counting signal and provides a timing signal at the output terminal accordingly.

Furthermore, there has been provided, in accordance with an embodiment of the present invention, a driving circuit for a lighting system, wherein the lighting system comprises a dimmer, a bridge rectifier and a light emission device, and wherein the driving circuit comprises: a detecting circuit having an input terminal coupled to an output terminal of the bridge rectifier and an output terminal configured to provide a detecting signal; a compensating circuit having an input terminal coupled to the output terminal of the detecting circuit and an output terminal configured to provide a compensated detecting signal; and a control circuit configured to adjust voltage or current of the light emission device based on the compensated detecting signal; wherein the compensating circuit comprises: a timing circuit, comprising: a first logic circuit having an input terminal, a first output terminal and a second output terminal, wherein the input terminal is coupled to the output terminal of the detecting circuit for receiving the detecting signal, and wherein based on a falling edge of the detecting signal, the first logic circuit provides a first logic signal and a second logic signal at the first output terminal and the second output terminal respectively; a first counter having a control terminal, a first output terminal and a second output terminal, wherein the control terminal is coupled to the second output terminal of the first logic circuit for receiving the second logic signal, and wherein based on the second logic signal, the first counter generates a first counting signal at the first output terminal and a second counting signal at the second output terminal, and wherein a counting period of the first counting signal is longer than a counting period of the second counting signal; a latching circuit having a control terminal, an input terminal and an output terminal, wherein the control terminal is coupled to the first output terminal of the first logic circuit for receiving the first logic signal, and wherein the input terminal is coupled to the first output terminal of the first counter for receiving the first counting signal, and wherein based on the first logic signal, the latching circuit samples and holds the first counting signal and provides a third counting signal at the output terminal; and a judging circuit having a first input terminal, a second input terminal and an output terminal, wherein the first input terminal is coupled to the second output terminal of the first counter for receiving the second counting signal, the second input terminal is coupled to the output terminal of the latching circuit for receiving the third counting signal, and wherein the judging circuit detects whether the second counting signal is equal to the third counting signal and provides a timing signal at the output terminal; and an operating circuit having a first input terminal, a second input terminal and an output terminal, wherein the first input terminal is coupled to the output terminal of the detecting circuit for receiving the detecting signal, and wherein the second input terminal is coupled to the output terminal of the timing circuit for receiving the timing signal, and wherein based on the detecting signal and the timing signal, the operating circuit provides the compensated detecting signal at the output terminal.

BRIEF DESCRIPTION OF THE DRAWINGS

Non-limiting and non-exhaustive embodiments are described with reference to the following drawings. The drawings are only for illustration purpose. Usually, the drawings only show part of the devices of the embodiments. These drawings are not necessarily drawn to scale. The relative sizes of elements illustrated by the drawings may differ from the relative size depicted.

DETAILED DESCRIPTION

In the present invention, numerous specific details are provided, such as examples of circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 3:
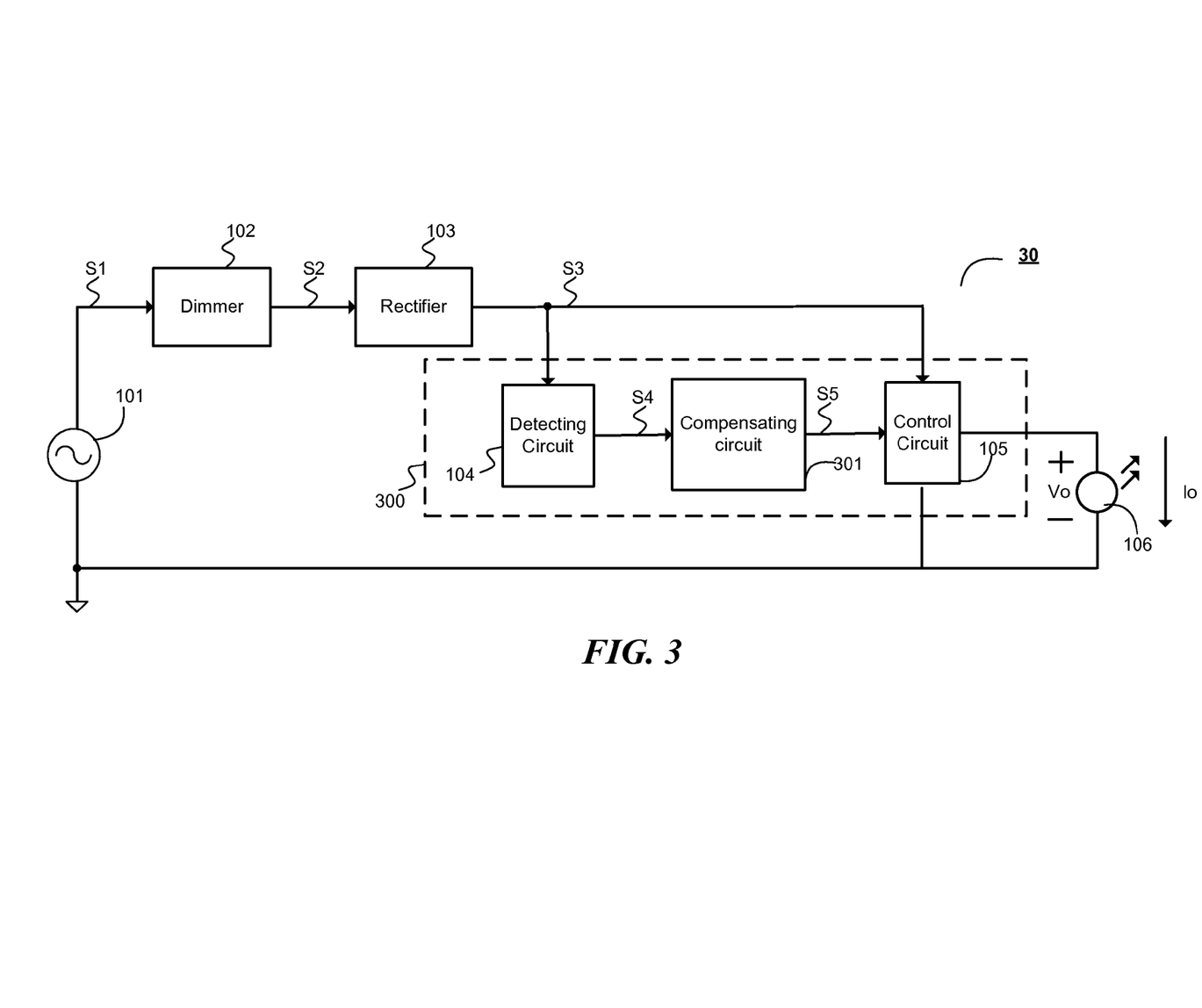
FIG. 3 schematically illustrates a lighting system 30 in accordance with an embodiment of the present invention.

FIG. 3 schematically illustrates a lighting system 30 in accordance with an embodiment of the present invention. The lighting system 30 comprises the power supply 101, the dimmer 102, the bridge rectifier 103, the light-emitting device 106 and a driving circuit 300. Compared with the driving circuit 100 of the lighting systems 10 shown in FIG. 1, the driving circuit 300 further comprises a compensating circuit 301. The compensating circuit 301 has an input terminal coupled to the output terminal of the detecting circuit 104 and an output terminal coupled to the input terminal of the control circuit 105. The compensating circuit 301 compensates the ON time or the duty cycle of the detecting signal S4, and provides a compensated detecting signal S5 at the output terminal. The control circuit 105 adjusts voltage or current of the light emission device 106 based on the compensated detecting signal S5.

Figure 4:
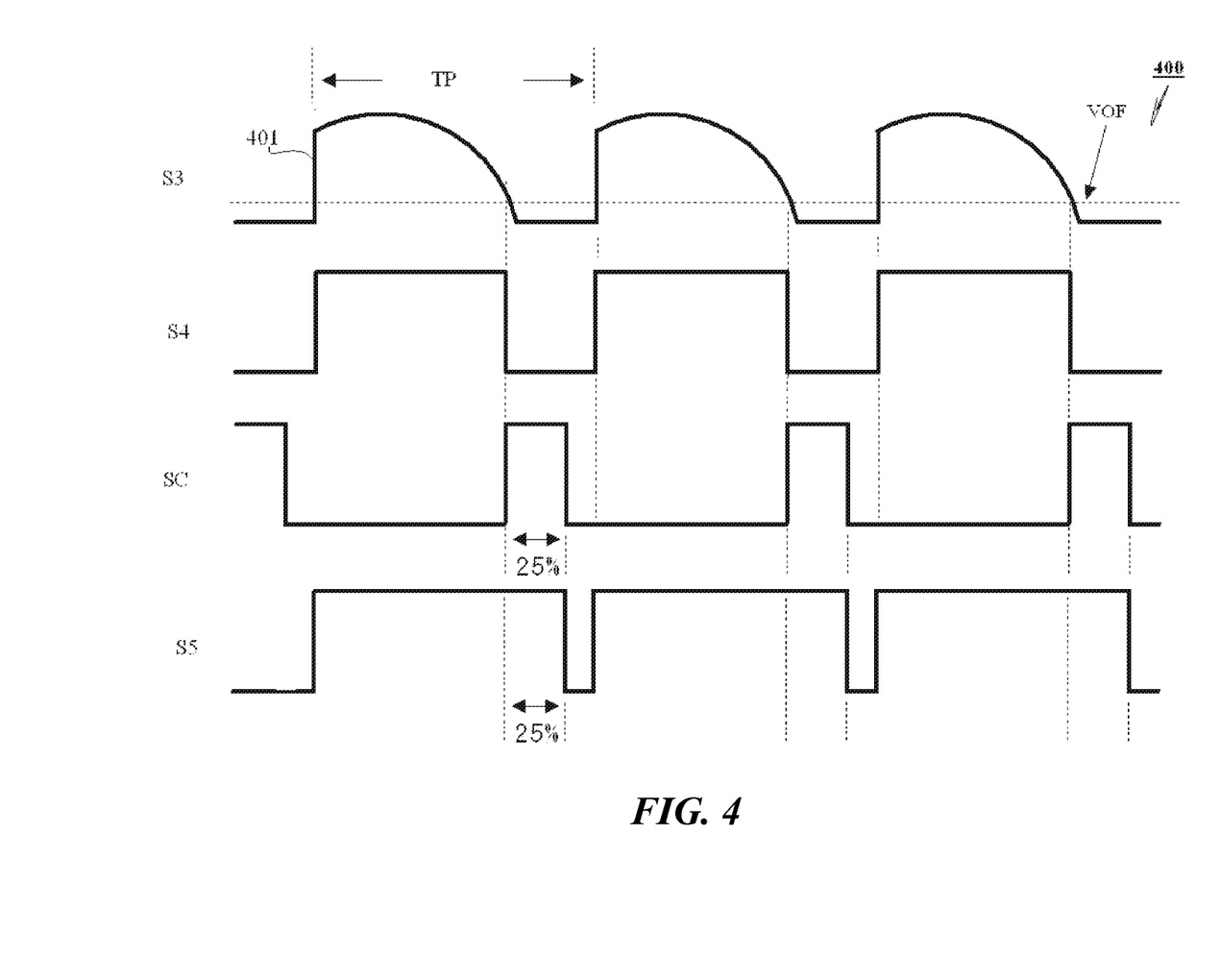
FIG. 4 illustrate operational waveforms 400 of the lighting system 30 in accordance with an embodiment of the present invention.

FIG. 4 illustrate operational waveforms 400 of the lighting system 30 in accordance with an embodiment of the present invention. In the leading edge dimming mode, the detecting signal S4 would be changed from the logic low level to the logic high level when the dimmer 102 is turned on. The detecting signal would be kept at the logic high level till the half wave signal S3 becomes lower than an off threshold VOFF, wherein the off threshold VOFF may be zero volts, a few volts, or tens of volts. The time from a step change of the half wave signal S3 to the next step change of the half wave signal S3 is defined as a detecting cycle TP. The time when the half wave signal S3 keeps logic high is defined as an ON time TON of the detecting signal S4, and the ratio of the ON time TON to the detecting cycle TP is defined as a duty cycle D.

The compensating circuit 301 compensates the ON time or the duty cycle of the detecting signal S4. The duty cycle of the detecting signal S4 is increased by a compensation duty cycle (e.g. 25%) if the duty cycle of the detecting signal S4 is smaller than a critical duty cycle (e.g. 75%). As shown in FIG. 4, the duty cycle of the detecting signal S4 is increased by 25%. The duty cycle of the detecting signal S4 is increased to a high duty cycle (e.g. 100%) if the duty cycle of the detecting signal is larger than the critical duty cycle (e.g. 75%).

In one embodiment, the driving circuit 105 adjusts the average current of the light-emitting devices 106 basing on the duty cycle of the compensated detecting signal S5, so as to adjust the brightness of the light-emitting devices 106. For example, the average current of the light-emitting device 106 is set to 0.8I when duty cycle of the compensated detecting signal S5 is 80%, the average current of the light-emitting device 106 is set to 0.9*I when the duty cycle of the compensated detecting signal S5 is 90%, and the average current of the light-emitting device 106 is set to I when duty cycle of the compensated detecting signal S5 is 100%. For the conventional lighting systems 10 shown in FIG. 1, the maximum average current of the light-emitting device 106 would be 0.85*1 since the maximum duty cycle of the detecting signal S4 is 85%. But, for the lighting systems 30 shown in FIG. 3, the maximum average current of the light-emitting device 106 would be I since the maximum duty cycle of the detecting signal has been compensated to 100%. With above technologies, one skilled in the arts could set the maximum average currents of different lighting systems to a same value, so as to provide uniform brightness.

Figure 5:
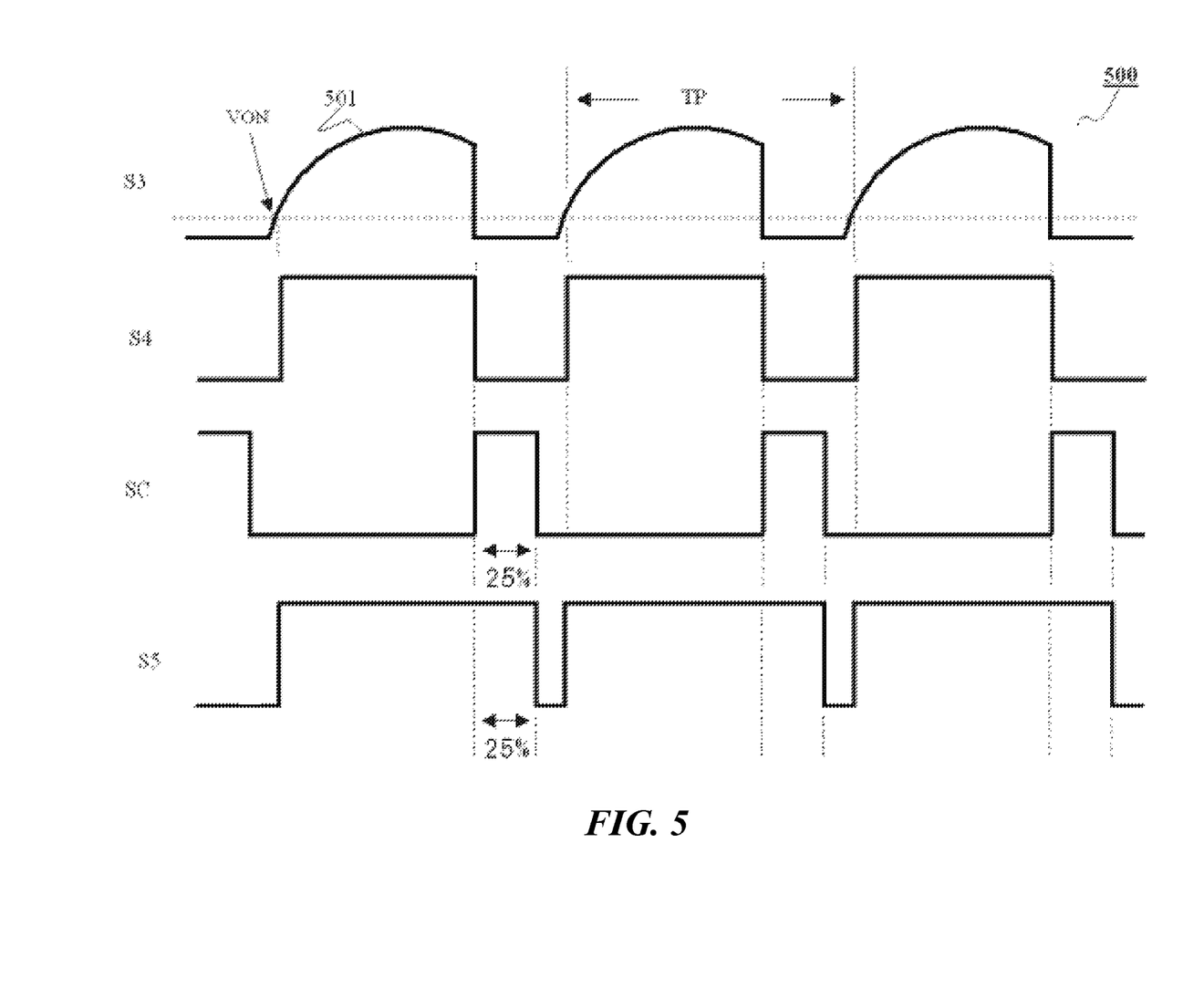
FIG. 5 illustrate operational waveforms 500 of the lighting system 30 in accordance with an embodiment of the present invention.

FIG. 5 illustrate operational waveforms 500 of the lighting system 30 in accordance with an embodiment of the present invention. In the falling edge dimming mode, the detecting signal S4 would be changed from the logic high level to the logic low level when the dimmer 102 is turned off. The detecting signal S4 would keep at the logic low level till the half wave signal becomes higher than an ON threshold VON, wherein the ON threshold VON may be zero volts, a few volts, or tens of volts.

Referring to FIG. 5, the duty cycle of the detecting signal S4 is increased by a compensation duty cycle (e.g. 25%) if the duty cycle of the detecting signal S4 is smaller than a critical duty cycle (e.g. 75%). The duty cycle of the detecting signal S4 is increased to a high duty cycle (e.g. 100%) if the duty cycle of the detecting signal is larger than the critical duty cycle (e.g. 75%)

The critical threshold can be set to 50%, 60% or 80%, and the compensation duty cycle can be set to 50%, 40% or 20%.

If the compensation duty cycle is too large (e.g. 50%), the duty cycle of compensated detecting signal would be 60% when the duty cycle of the dimmer is 10%, which would limit the dimming range of the light-emitting device 106.

In order to solve the above problem, according to one embodiment of the invention, the duty cycle of the detecting signal S4 is increased by a second compensation duty cycle (e.g. 0%) if the duty cycle of the detecting signal S4 is smaller than a second critical duty cycle (e.g. 10%). In another embodiment, the duty cycle of the detecting signal S4 is increased by 10% if the duty cycle of the detecting signal S4 is 20%, and the duty cycle of the detecting signal S4 is increased by 20% if the duty cycle of the detecting signal S4 is 60%.

Figure 6:
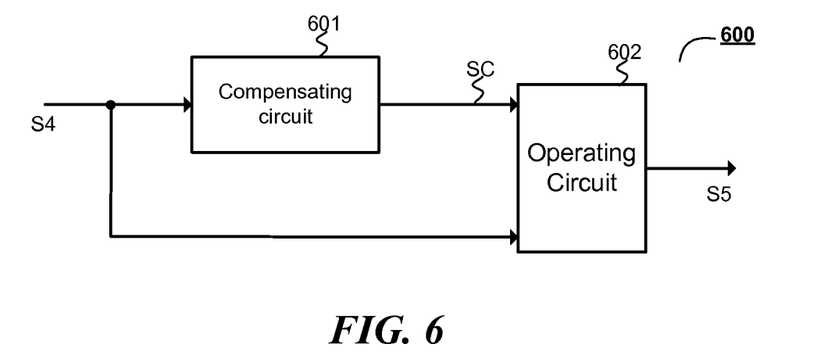
FIG. 6 schematically illustrates a compensating circuit 600 in accordance with an embodiment of the present invention.

FIG. 6 schematically illustrates a compensating circuit 600 in accordance with an embodiment of the present invention. The compensating circuit 600 comprises a timing circuit 601 and an operating circuit 602. The timing circuit 601 has an input terminal coupled to the output terminal of the detecting circuit 104 and an output terminal configured to provide a timing signal SC. The timing signal SC would change from the logic low level to the logic high level at the falling edge of the detecting signal S4. In one embodiment, the high level duration of the timing signal SC is related to the duty cycle of the detecting signal S4. In one embodiment, the high level duration of the timing signal SC is preset to 25% of the detecting period. In one embodiment, the timing circuit 601 could be the realized by a digital timer or an analog timer composed of capacitors and current sources. The operating circuit 602 has a first input terminal coupled to the output terminal of the detecting circuit 104, a second input terminal coupled to the output terminal of the timing circuit 601, and an output terminal configured to provide the compensated detecting signal S5. In one embodiment, the operating circuit 602 is an OR logic gate.

Figure 7:
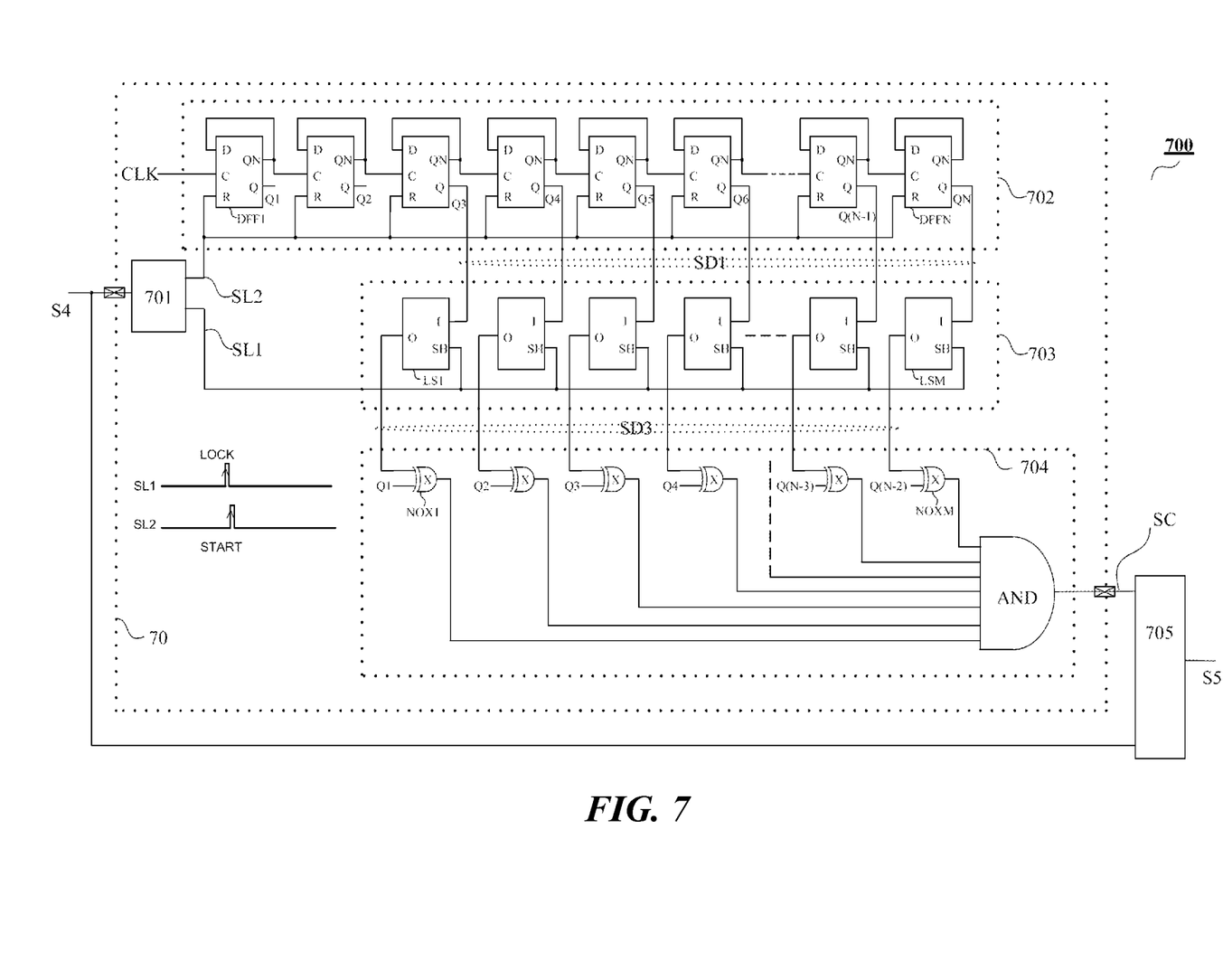
FIG. 7 schematically illustrates a compensating circuit 700 in accordance with an embodiment of the present invention.

FIG. 7 schematically illustrates a compensating circuit 700 in accordance with an embodiment of the present invention. The compensating circuit 700 comprises a timing circuit 70 and operating circuit 705. The timing circuit 70 comprises a first logic circuit 701, a first counter 702, a latching circuit 703 and a judging circuit 704.

Figure 8:
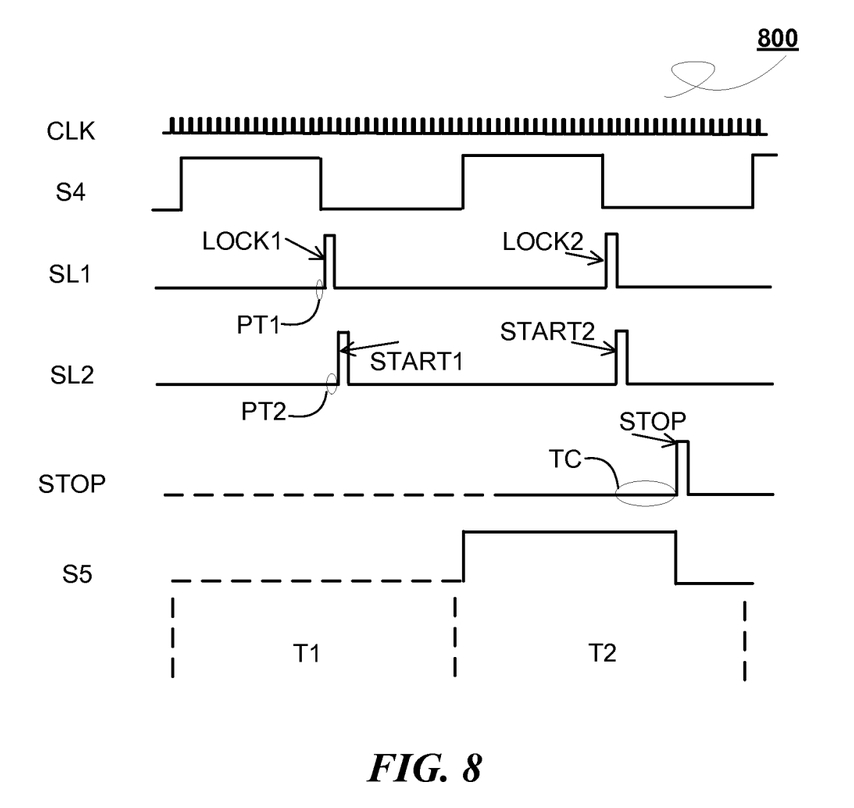
FIG. 8 illustrate operational waveforms 800 of the compensating circuit 700 in accordance with an embodiment of the present invention.

The first logic circuit 701 has an input terminal, a first output terminal and a second output terminal. The input terminal of the first logic circuit 701 is served as an input terminal of the timing circuit 700 for receiving the detecting signal S4. The first logic circuit 701 provides a first logic signal SL1 at the first output terminal and a second logic signal SL2 at the second output terminal. In one embodiment, as shown in FIG. 8, the first logic signal SL1 generates a lock-counting status LOCK at a first time PT1 from the falling edge of the detecting signal S4, wherein the lock-counting status LOCK in a first period T1 is called the first lock-counting status LOCK1, and the lock-counting status LOCK in a second period T2 is called the second lock-counting status LOCK2. The second logic signal SL2 generates a start-counting status START in a second time PT2 from the falling edge of the detecting signal S4, wherein the start-counting status START in the first period T1 is called the first start—counting status START1, and the start-counting status START in the second period T2 is called the second start—counting status START2. The second time PT2 is longer than the first time PT1. Normally, the first time PT1 and the second time PT2 are both short, the first time PT1 can be only a few microseconds or even zero, the second time PT2 is tens of microseconds or less.

The first counter 702 comprises a plurality of series-connected D flip-flops DFF1, DFF2 . . . DFFN, each D flip-flop comprises a control terminal R, a clock terminal C, a signal terminal D, an output terminal Q and an inverted output terminal QN. The D terminal and the QN terminal of each D flip-flop are coupled together and connected to the C terminal of the next D flip-flop. The output terminals of the D flip-flops DFF1~DFFN are configured to serve as output terminals of the first counter 702 for providing logic signals Q1, Q2 . . . QN. The C terminal of DFF1 is configured to serve as a clock terminal of the first counter 702 for receiving a high frequency clock signal CLK. The control terminals R of DFF1~DFFN are coupled together and configured to serve as a control terminal of the first counter 702 for receiving the second logic signal SL2.

The first counter 702 begins to count when it receives the start-counting status START of the second logic signal SL2, N-bit digital counting signal comprised of QN . . . Q2Q1 begins to carry gradually from 00000000 (assuming N=8), and the carry step is a period of the clock signal CLK. Higher N−2 bits of the N-bit digital counting signal, (Q8 . . . Q4Q3), is defined as a first counting signal SD1, lower N−2 bits of the N-bit digital counting signal, (Q6 . . . Q2Q1), is defined as a second counting signal SD2. The carry step of the second counting signal SD2 is one period of the clock signal CLK, the carry step of the first counting signal SD1 is 4 periods of the clock signal CLK, so carry rate of the second counting signal SD2 is 4 times the carry rate of the first digital signal SD1. Defining the time that should be taken by a digital signal for changing from 00000000 to 11111111 as a counting period. The counting period of the first digital signal SD1 is 3 times longer than that of the second counting signal SD2.

The latching circuit 703 comprises a plurality of registers LS1~LSM, each register has a control terminal SH, an input terminal I and an output terminal O. The input terminals of the registers LS1~LSM are configured to receive the first counting signal SD1. The control terminals of the registers LS1~LSM are coupled together and configured to serve as the control terminal of the latching circuit for receiving first logic signal SL1. The output terminals of the registers LS1~LSM are configured to provide a third counting signal SD3. In one embodiment, receiving the lock-counting status LOCK of the first logic signal SL1 (e.g. LOCK1), the latching circuit 703 samples and holds the first counting signal SD1 till receives the next lock-counting status LOCK of the first logic signal SL1 (e.g. LOCK2).

The judging circuit 704 comprises a plurality of XNOR gates NOX1~NOXM and an AND gate with M input terminals respectively coupled to the output terminals of NOX1~NOXM. Each XNOR gate has a first input terminal, a second input terminal and an output terminal. The first input terminals of the XNOR gates NOX1~NOXM are configured to receive the second digital signal SD2. The second input terminals of the XNOR gates NOX1~NOXM are configured to receive the third digital signal SD3. The output terminal of the AND gate is configured to serve as an output terminal of the judging circuit 704 for providing a timing signal SC. The timing signal SC would change from logic low level to the logic high level when the second SD2 digital signal and the third digital signal SD3 are equal.

The operating circuit 705 has a first input terminal, a second input terminal and an output terminal. The first input terminal of the operating circuit 705 is coupled to the output terminal of the detecting circuit 104 for receiving the detecting signal S4. The second input terminal of the operating circuit 705 is coupled to the output terminal of the judging circuit 704 for receiving the timing signal SC. Based on the detecting signal S4 and the timing signal SC, the operating circuit 705 provides the compensated detecting signal S5 at the output terminal. In one embodiment, the operating circuit 705 is a RS flip-flop. In one embodiment, the compensated detecting signal S5 changes to logical high level at the rising edge of the detecting signal S4, and changes to logical low at the rising edge of the timing signal SC.

FIG. 8 illustrate operational waveforms 800 of the compensating circuit 700 according to an embodiment of the present invention. It is supposed that the duty cycle of the detecting signal S4 is 50%. In the first operational cycle T1, a rising edge is generated on the first logic signal SL1 as a first lock-counting status LOCK1 at the first time PT1 from the falling edge of the detecting signal S4. A rising edge is also generated on the second logic signal SL2 as a first start-counting status START1 to trigger the first counter 702 at the second time PT2 from the falling edge of the detecting signal S4. Once receiving the second lock-counting status LOCK2 of the first logic signal SL1, the latching circuit 704 samples and holds the first counting signal SD1. Later, when the second start-counting status START2 is received, the second logic signal SL2 resets the counter 702. Since the first counter 702 begins to count when it receives the start-counting status START, this moment is defined as a counting moment. Because the latching circuit 703 latches the first counting signal SD1 when it receives the lock-counting status LOCK, this moment is defined as a locking moment. As the time period between the falling edge of the second operational cycle T2 of the second detecting signal S4 and the second lock-counting status LOCK2 of the first logic signal SL1 is relatively short (the first time PT1 is short), it is suppose that the time period between the start-counting status START1 and the second lock-counting status LOCK2 is equal to a detecting cycle TP. Supposing that the output (Q8-Q1) of the counter 702 is 10101010, the latching 703 latches the higher 6-bit 101010 as the first counting signal SD1. After then, once receiving the second start-counting status START2 of the second logic signal SL2, the first counter 702 begins to recount, the output of the first counter 702 steps up from 00000000. When the output (Q8-Q1) is 00101010, i.e. the second counting signal SD2 is 101010, the timing signal SC switches from low level to high level to generate stop counting status STOP. As the step rate of the second counting signal SD2 is 4 times of the step rate of the first counting signal SD1, the period between the second start-counting status START2 and the stop counting status STOP, which is referred as the compensating time TC, is one fourth of the detecting cycle TP. In steady state, the dimming button of the TRIAC is fixed and therefore the detecting cycle TP is also fixed. Thus the compensating time TC is one fourth of the current detecting cycle TP. Even the dimming button being turned, because of relatively slow turning rate, i.e. a relatively small difference between the first cycle T1 and the second cycle T2, it could be approximately considered that the compensating time TC is one fourth of the current detecting cycle TP.

The operating circuit 705 generates a compensated detecting signal S5, the duty cycle of which is 25% plus the duty cycle of detecting signal S4. Similarly, if the first counting signal fetches the highest N-3 bits of the N-bit digital counting signal, and the second counting signal fetches the lowest N-3 bits of the N-bit digital counting signal, then the duty cycle of detecting signal is increased by 12.5%. In the embodiments shown in FIG. 7 and FIG. 8, the digital counting signal composed by QN, QN-1, . . . , Q2, Q1 is a step-by-step carried binary data. However, in other embodiments, the digital counting signal may not be carried step-by-step. For instance, one with ordinary skill in the art may randomly choose M bits of the N-bit digital counting signal respectively as the first counting signal SD1 and the second digital signal SD2 according to proposed proportion, if only the counting cycle of the second counting signal SD2 is smaller than the counting cycle of the first digital signal SD1. For example, the first counting signal SD1 is Q8Q7Q6Q4, and the second counting signal SD2 is Q6Q5Q2Q1. For the above embodiment, supposing the corresponding digital counting signal is 10101010, the detecting cycle TP is 168 clock cycles ($2^1+2^3+2^5+2^7=168$). The first counting signal SD1 is 1011 (Q8Q7Q6Q4). When the digital counting signal changes to 00010011, the second counting signal SD2 is 1011 (Q6Q5Q2Q1), and equals to the first counting signal SD1. It takes 19 clock cycles ($2^0+2^1+2^4=19$) for the digital counting signal changing from 00000000 to 00010011. Accordingly, the compensating time TC is 11.3% (19/168) of the detecting cycle TP. According to the teaching of above embodiment, one with ordinary skill in the art could obtain proposed proportion by properly setting the first counting signal and the second counting signal.

In one embodiment, the first logic circuit 701 delays the falling edge of the detecting signal S4, to ensure that the start-counting status START of the second logic signal SL2 is later than the lock-counting status LOCK of the first logic signal SL1. Thus the latching circuit 704 could sample and hold the first counting signal SD1 before the reset of the counter 702. In certain embodiments, the first logic signal SL1 may be equal to the second logic signal SL2. At this time, the first logic circuit 701 may provide a pulse signal with very short pulse width as the first logic signal SL1 (also the second logic signal SL2). The rising edge and falling edge of the first logic signal SL1 are respectively used as the lock-counting status LOCK and the start-counting status START. Correspondingly, The latching circuit 703 latches the first counting signal SD1 and generates a third counting signal SD3 at the rising edge of the first logic signal SL1. The first counter 702 begins to count at the falling edge of the first logic signal SL1. In certain embodiments, the detecting signal S4 is configured as the first logic signal S1 (i.e. the two signals are identical), and the falling edge of the detecting signal S4 is used as the lock-counting status LOCK.

The first counter 702 may reset and recount when its control terminal receives a rising edge, or reset and recount when the control terminal receives a falling edge, or reset when the control terminal receives a rising edge and then recount when the control terminal receives a falling edge. One with ordinary skill in the art may understand that the first counter 702 may reset and recount according to high/low level, rising/falling edge or their combination.

Figure 9:
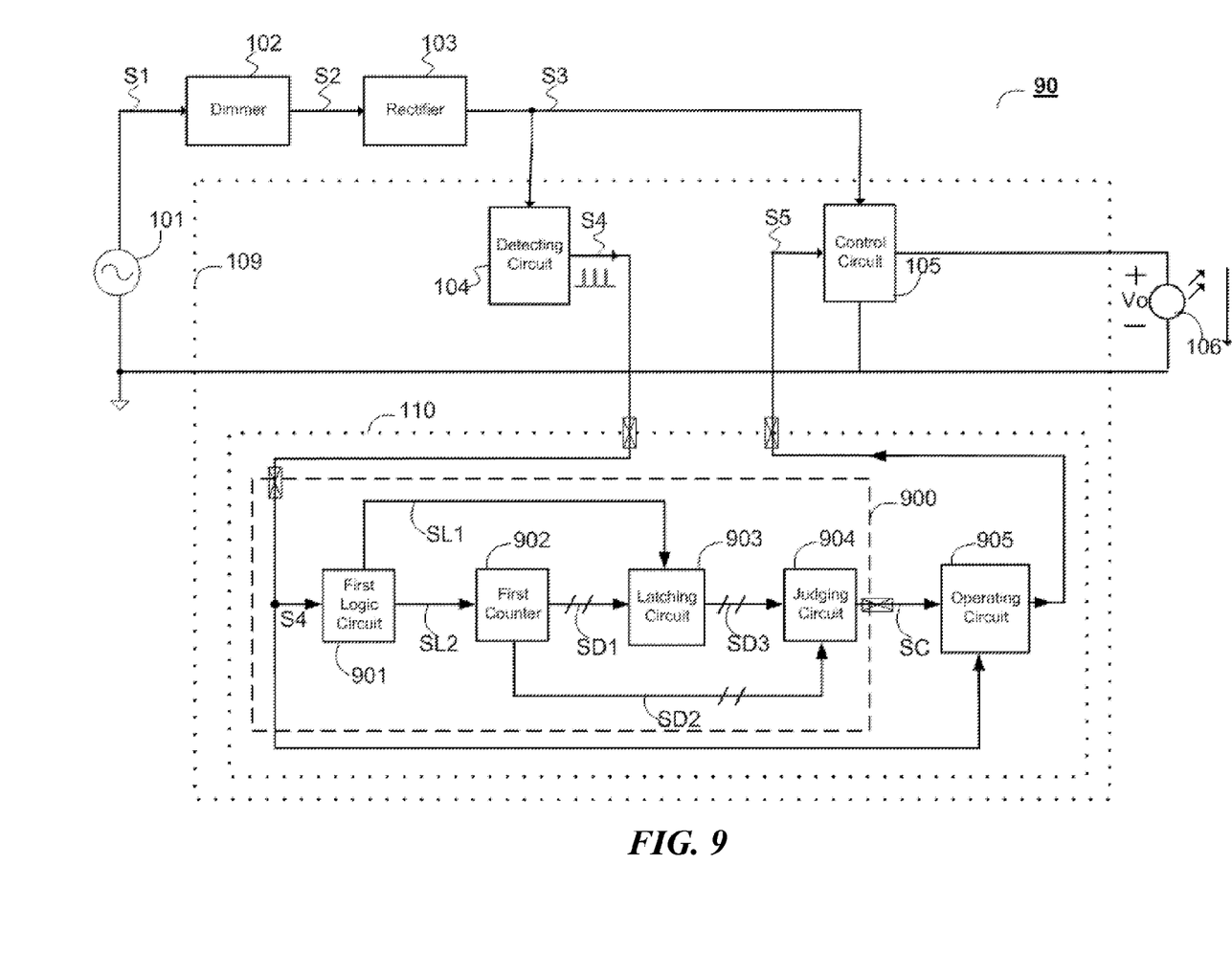
FIG. 9 schematically illustrates a lighting system 90 in accordance with an embodiment of the present invention

FIG. 9 schematically illustrates a lighting system 90 in accordance with an embodiment of the present invention. The lighting system 90 comprises the power supply 101, the dimmer 102, the bridge rectifier 103, the light-emitting device 106 and a driving circuit 109.

The driving circuit 109 comprises a detecting circuit 104, a compensating circuit 110 and a control circuit 105. The detecting circuit 104 has an input terminal coupled to the output terminal of the bridge rectifier 103 and an output terminal configured to provide a detecting signal S4. The compensating circuit 110 has an input terminal coupled to the output terminal of the detecting circuit 104 and an output terminal configured to provide a compensated detecting signal S5. The control circuit 105 is configured to adjust voltage or current of the light emission device 106 based on the compensated detecting signal S5.

The compensating circuit 110 comprises a timing circuit 900 and an operating circuit 905. The operating circuit 905 has a first input terminal, a second input terminal and an output terminal, wherein the first input terminal is coupled to the output terminal of the detecting circuit 104 for receiving the detecting signal S4, the second input terminal is coupled to the output terminal of the timing circuit 900 for receiving the timing signal SC, and wherein based on the detecting signal S4 and the timing signal SC, the operating circuit 905 provides the compensated detecting signal S5 at the output terminal.

The timing circuit 900 comprises a first logic circuit 901, a first counter 902, a latching circuit 903 and a judging circuit 904.

The first logic circuit 901 has an input terminal, a first output terminal and a second output terminal. The input terminal of the first logic circuit 901 is configured to receive the detecting signal S4. Based on a fall edge of the detecting signal S4, the first logic circuit 901 provides a first logic signal SL1 and a second logic signal SL2 at the first output terminal and the second output terminal respectively.

The first counter 902 has a control terminal, a first output terminal and a second output terminal. The control terminal of the first counter 902 is coupled to the second output terminal of the first logic circuit 901 for receiving the second logic signal SL2. Based on the second logic signal SL2, the first counter 902 generates a first counting signal SD1 at the first output terminal and a second counting signal SD2 at the second output terminal, and wherein the counting period of the first counting signal SD1 is longer than the counting period of the second counting signal SD2.

The latching circuit 903 has a control terminal, an input terminal and an output terminal. The control terminal of the latching circuit 903 is coupled to the first output terminal of the first logic circuit 901 for receiving the first logic signal SL1. The input terminal of the latching circuit 903 is coupled to the first output terminal of the first counter 902 for receiving the first counting signal SD1. Based on the first logic signal SL1, the latching circuit 903 samples and holds the first counting signal SD1 and provides a third counting signal SD3 at the output terminal.

The judging circuit 904 has a first input terminal, a second input terminal and an output terminal. The first input terminal of the judging circuit 904 is coupled to the second output terminal of the first counter 902 for receiving the second counting signal SD2. The second input terminal of the judging circuit 904 is coupled to the output terminal of the latching circuit 903 for receiving the third counting signal SD3. The judging circuit detects whether the second counting signal SD2 is equal to the third counting signal SD3 and provides the timing signal SC at the output terminal.

Timing circuits and driving circuits used in lighting systems have been disclosed. While specific embodiments of the present invention have been provided in the above description, it should be understood that these embodiments are for illustration purposes and not intend to limit the present invention. Many additional embodiments will be apparent to persons of ordinary skill in the art under the spirit of the present invention.

We claim:

1. A timing circuit, comprising:
a first logic circuit having an input terminal, a first output terminal and a second output terminal, wherein the input terminal is configured to receive a detecting signal, and wherein based on a falling edge of the detecting signal, the first logic circuit provides a first logic signal and a second logic signal at the first output terminal and the second output terminal respectively;
a first counter having a control terminal, a first output terminal and a second output terminal, wherein the control terminal is coupled to the second output terminal of the first logic circuit for receiving the second logic signal, and wherein based on the second logic signal, the first counter generates a first counting signal at the first output terminal and a second counting signal at the second output terminal, and wherein a counting period of the first counting signal is longer than a counting period of the second counting signal;
a latching circuit having a control terminal, an input terminal and an output terminal, wherein the control terminal is coupled to the first output terminal of the first logic circuit for receiving the first logic signal, and wherein the input terminal is coupled to the first output terminal of the first counter for receiving the first counting signal, and wherein based on the first logic signal, the latching circuit samples and holds the first counting signal and provides a third counting signal at the output terminal; and
a judging circuit having a first input terminal, a second input terminal and an output terminal, wherein the first input terminal is coupled to the second output terminal of the first counter for receiving the second counting signal, the second input terminal is coupled to the output terminal of the latching circuit for receiving the third counting signal, and wherein the judging circuit detects whether the second counting signal is equal to the third counting signal and provides a timing signal at the output terminal accordingly.

2. The timing circuit of claim 1, wherein the first logic signal and the second logic signal are the same.

3. The timing circuit of claim 1, wherein the first logic signal and the detecting signal are the same.

4. The timing circuit of claim 1, wherein the latching circuit samples and holds the first counting signal for a first time period from a falling edge of the detecting signal, and wherein the first counter starts to count for a second time period from the falling edge of the detecting signal, and wherein the second time period is longer than the first time period.

5. The timing circuit of claim 4, wherein the first time period is zero.

6. The timing circuit of claim 1, wherein either the first logic signal or the second logic signal is a pulse signal.

7. The timing circuit of claim 1, wherein the first counter comprises N terminals configured to provide an N-bit digital signal, and wherein the first counting signal is comprised of the high N-M bits of the N-bit digital signal, the second counting signal is comprised of the low N-M bits of the N-bit digital signal, and wherein M is an integer smaller than N.

8. The timing circuit of claim 7, wherein the difference between N and M is 2 or 3.

9. The timing circuit of claim 7, wherein the N-bit digital signal is a binary data with successively-incremented-carry-number.

10. A driving circuit for a lighting system, wherein the lighting system comprises a dimmer, a bridge rectifier and a light emission device, and wherein the driving circuit comprises:
a detecting circuit having an input terminal coupled to an output terminal of the bridge rectifier and an output terminal configured to provide a detecting signal;
a compensating circuit having an input terminal coupled to the output terminal of the detecting circuit and an output terminal configured to provide a compensated detecting signal; and
a control circuit configured to adjust voltage or current of the light emission device based on the compensated detecting signal;
wherein the compensating circuit comprises:
a timing circuit, comprising:

a first logic circuit having an input terminal, a first output terminal and a second output terminal, wherein the input terminal is coupled to the output terminal of the detecting circuit for receiving the detecting signal, and wherein based on a falling edge of the detecting signal, the first logic circuit provides a first logic signal and a second logic signal at the first output terminal and the second output terminal respectively;

a first counter having a control terminal, a first output terminal and a second output terminal, wherein the control terminal is coupled to the second output terminal of the first logic circuit for receiving the second logic signal, and wherein based on the second logic signal, the first counter generates a first counting signal at the first output terminal and a second counting signal at the second output terminal, and wherein a counting period of the first counting signal is longer than a counting period of the second counting signal;

a latching circuit having a control terminal, an input terminal and an output terminal, wherein the control terminal is coupled to the first output terminal of the first logic circuit for receiving the first logic signal, and wherein the input terminal is coupled to the first output terminal of the first counter for receiving the first counting signal, and wherein based on the first logic signal, the latching circuit samples and holds the first counting signal and provides a third counting signal at the output terminal;

a judging circuit having a first input terminal, a second input terminal and an output terminal, wherein the first input terminal is coupled to the second output terminal of the first counter for receiving the second counting signal, the second input terminal is coupled to the output terminal of the latching circuit for receiving the third counting signal, and wherein the judging circuit detects whether the second counting signal is equal to the third counting signal and provides a timing signal at the output terminal; and an operating circuit having a first input terminal, a second input terminal and an output terminal, wherein the first input terminal is coupled to the output terminal of the detecting circuit for receiving the detecting signal, and wherein the second input terminal is coupled to the output terminal of the timing circuit for receiving the timing signal, and wherein based on the detecting signal and the timing signal, the operating circuit provides the compensated detecting signal at the output terminal.

11. The driving circuit of claim 10, wherein the duty cycle of the detecting signal is increased by a compensation duty cycle determined by the timing signal if the duty cycle of the detecting signal is smaller than a critical duty cycle, and wherein the duty cycle of the detecting signal is increased to a high duty cycle if the duty cycle of the detecting signal is larger than the critical duty cycle.

12. The driving circuit of claim 11, wherein the critical duty cycle is 75%, and the compensation duty cycle is 25%, and the high duty cycle is 100%.

13. The timing circuit of claim 10, wherein the first logic signal and the second logic signal are the same.

14. The driving circuit of claim 10, wherein the first logic signal and the detecting signal are the same.

15. The driving circuit of claim 10, wherein the latching circuit samples and holds the first counting signal for a first time period from a falling edge of the detecting signal, and wherein the first counter starts to count for a second time period from the falling edge of the detecting signal, and wherein the second time period is longer than the first time period.

16. The driving circuit of claim 15, wherein the first time period is zero.

17. The driving circuit of claim 10, wherein the first logic signal or the second logic signal is a pulse signal.

18. The driving circuit of claim 10, wherein the first counter is comprised of N terminals configured to provide a N-bit digital signal, and wherein the first counting signal is comprised of the high N-M bits of the N-bit digital signal, the second counting signal is comprised of the low N-M bits of the N-bit digital signal, and wherein M is an integer smaller than N.

19. The driving circuit of claim 18, wherein the difference between N and M is 2 or 3.

20. The driving circuit of claim 18, wherein the N-bit digital signal is a binary data with successively-incremented-carry-number.

* * * * *